US009929186B2

(12) United States Patent
Konomi et al.

(10) Patent No.: US 9,929,186 B2
(45) Date of Patent: Mar. 27, 2018

(54) THIN FILM TRANSISTOR SUBSTRATE AND METHOD FOR MANUFACTURING THE SAME

(71) Applicant: Mitsubishi Electric Corporation, Tokyo (JP)

(72) Inventors: Takaharu Konomi, Kumamoto (JP); Kazunori Inoue, Kumamoto (JP); Naoki Tsumura, Kumamoto (JP); Kensuke Nagayama, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/460,007

(22) Filed: Mar. 15, 2017

(65) Prior Publication Data

US 2017/0278866 A1    Sep. 28, 2017

(30) Foreign Application Priority Data

Mar. 22, 2016    (JP) ................. 2016-056560

(51) Int. Cl.
*H01L 27/12*    (2006.01)
*H01L 29/786*    (2006.01)
*H01L 29/66*    (2006.01)

(52) U.S. Cl.
CPC ...... *H01L 27/124* (2013.01); *H01L 29/66742* (2013.01); *H01L 29/7869* (2013.01)

(58) Field of Classification Search
CPC ............. H01L 27/124; H01L 29/66742; H01L 29/7869
See application file for complete search history.

(56) References Cited

U.S. PATENT DOCUMENTS 6,449,026 B1    9/2002   Min et al.
8,872,171 B2   10/2014   Yamazaki et al.
(Continued)

FOREIGN PATENT DOCUMENTS

JP    S62-235784 A    10/1987
JP    2001-056474 A    2/2001
(Continued)

OTHER PUBLICATIONS

Nomura et al.; Room-temperature Fabrication of Transparent Flexible Thin-film Transistors Using Amorphous Oxide Semiconductors; Nature, 432; 2004; pp. 488-492.

*Primary Examiner* — Dung Le
(74) *Attorney, Agent, or Firm* — Studebaker & Brackett PC

(57) ABSTRACT

A thin film transistor substrate includes: a thin film transistor including: a first insulating film covering a gate electrode; a semiconductor channel layer selectively provided on the first insulating film; a second insulating film provided on the semiconductor channel layer; a first source electrode and a first drain electrode selectively provided on the second insulating film, a second source electrode and a second drain electrode provided on the first source electrode and the first drain electrode, respectively, a third insulating film that covers the second source electrode and the second drain electrode; a third source electrode connected to the semiconductor channel layer via a first contact hole provided through the third insulating film, the second and the first source electrode; a third drain electrode connected to the semiconductor channel layer via a second contact hole provided through the third insulating film, the second drain electrode, and the first drain electrode.

13 Claims, 16 Drawing Sheets

(56) References Cited

U.S. PATENT DOCUMENTS

| | | | |
|---|---|---|---|
| 9,209,203 B2 * | 12/2015 | Inoue | H01L 27/1225 |
| 9,461,077 B2 | 10/2016 | Inoue et al. | |
| 9,508,750 B2 | 11/2016 | Hiwatashi et al. | |
| 9,553,109 B2 * | 1/2017 | Konomi | H01L 27/1225 |
| 2009/0189153 A1 | 7/2009 | Iwasaki et al. | |
| 2013/0023086 A1 | 1/2013 | Chikama et al. | |
| 2014/0070211 A1 | 3/2014 | Iwasaki et al. | |
| 2015/0048363 A1 | 2/2015 | Yamazaki et al. | |
| 2016/0190184 A1 | 6/2016 | Imamura et al. | |

FOREIGN PATENT DOCUMENTS

| | | |
|---|---|---|
| JP | 2005-077822 A | 3/2005 |
| JP | 2007-281409 A | 10/2007 |
| JP | 2011-009719 A | 1/2011 |
| WO | 2011/077607 A1 | 6/2011 |

* cited by examiner

THIN FILM TRANSISTOR SUBSTRATE AND METHOD FOR MANUFACTURING THE SAME

BACKGROUND OF THE INVENTION

Field of the Invention

The present invention relates to a TFT active matrix substrate (hereinafter referred to as a "TFT substrate") including a thin film transistor (TFT) as a switching device, and to a method for manufacturing the same.

Description of the Background Art

TFT substrates are used in electro-optic devices, such as displays including liquid crystals (liquid crystal displays; LCDs). Semiconductor devices such as TFTs are characteristic in low power consumption and slim designs, and taking advantage of such characteristics, actively adopted to flat-panel displays developed as an alternative to CRTs (Cathode Ray Tubes).

Liquid crystal displays (LCD) typically include passive matrix LCDs, and TFT-LCDs in which a TFT is used as a switching device. In particular, TFT-LCDs are superior to CRTs (Cathode Ray Tubes) and passive matrix LCDs in portability and visual quality, and have become widely used for display products such as mobile computers, notebook computers, and television sets.

In general, a TFT-LCD includes a liquid crystal display panel configured such that a liquid crystal layer is sandwiched between a TFT substrate having a plurality of TFTs arranged in an array and a counter substrate having a color filter and the like. A polarizing plate is provided for each of a front side and a back side of the liquid crystal display panel, and a backlight is further provided outside for one of the front side and the back side. With such a configuration, favorable color display quality may be achieved.

LCDs (IPS-LCDs) of an IPS (In Plane Switching, IPS is a registered trademark of Japan Display Inc.) mode, which is a lateral electric field driving mode for driving liquid crystals with improved TFT-LCD viewing angles are widely used in display devices and the like utilizing its characteristic of wide viewing angles. However, LCDs also include problems such as a low aperture ratio and low transmissivity at pixel display portions, and it is difficult to achieve bright display properties. A major reason for this is that an electric field for driving liquid crystals does not work effectively above pixel electrodes having a comb teeth shape used for IPS-LCDs, and a part of the liquid crystals above the pixel electrodes are not activated. In order to improve this problem, an LCD (FFS-LCD) of a FFS (Fringe Field Switching) mode as disclosed in Japanese Patent Application Laid-Open No. 2001-56474, for example, is proposed.

Here, in manufacturing TFT substrates for common FFS-LCDs as disclosed in Japanese Patent Application Laid-Open No. 2001-56474, it is generally required to perform a photolithography process at least six times in total including: (1) gate electrode formation process, (2) pixel electrode formation process, (3) gate insulating film and semiconductor film formation process, (4) source electrode and drain electrode formation process, (5) contact hole formation process to a protective insulating film, and (6) common electrode (also referred to as counter electrode) formation process.

Conventionally, in switching devices for a TFT substrate for a liquid crystal display, amorphous silicon (a-Si) is used for semiconductor films for forming TFT active layers (channel layers). In recent years, TFTs using oxide semiconductor for active layers are actively developed. Oxide semiconductor has mobility higher than that of conventional amorphous silicon, and is advantageously capable of achieving small and high performance TFTs.

Major examples of the oxide semiconductor used include a zinc oxide (ZnO) based material, and an amorphous InGaZnO based material in which gallium oxide ($Ga_2O_3$) and indium oxide ($In_2O_3$) are added to zinc oxide. These techniques are disclosed in Japanese Patent Application Laid-Open No. 2005-77822, Japanese Patent Application Laid-Open No. 2007-281409, and Kenji Nomura et al (2004), "Room-temperature Fabrication of Transparent Flexible Thin-film Transistors Using Amorphous Oxide Semiconductors", Nature, 432: 488-492.

In general, similarly to oxide conductors such as amorphous ITO (indium oxide ($In_2O_3$)+tin oxide ($SnO_2$)) and amorphous InZnO (indium oxide ($In_2O_3$)+zinc oxide (ZnO)) that are transparent conductors, these oxide semiconductor materials may be etched with a weak acid solution such as oxalic acid and carboxylic acid, and has an advantage of an easy patterning process.

However, such oxide semiconductor materials can take damages due to etching by an acid solution used in etching for processing common metal films (for example, Cr, Ti, Mo, Ta, Al, Cu, and an alloy of these metals) for source electrodes and drain electrodes in TFTs, and therefore their properties can be deteriorated. Further, some of oxide semiconductor materials may be dissolved in such an acid solution depending on their types. Therefore, for example, as disclosed by part (b) of FIG. 11 of Japanese Patent Application Laid-Open No. 2007-281409, when TFTs configured such that source electrodes and drain electrodes are arranged on a channel layer made of oxide semiconductor (generally referred to as back-channel etched (BCE) TFTs) are to be manufactured, an acid solution used for processing the source electrodes and the drain electrodes can often damage the channel layer to deteriorate TFT properties. Moreover, when a metal film to be source electrodes and drain electrode is formed over an oxide semiconductor film (channel layer), redox reaction in a boundary between the films can often damage the channel layer to deteriorate TFT properties.

In order to solve such problems, as illustrated in FIG. 1 of Japanese Patent Application Laid-Open No. 62-235784 (1987) and FIG. 6 of WO2011/077607, it is conceivable to utilize a TFT configuration in which a protective insulating film is provided as an upper layer over a semiconductor film. With this TFT configuration, it is possible to prevent an oxide semiconductor film from taking damages or disappearing due to etching for processing a metal film into source electrodes and drain electrodes. TFTs of this configuration are generally referred to as etching stopper or etch stopper (ES) TFTs.

However, utilizing a common FFS-LCD TFTs disclosed in Japanese Patent Application Laid-Open No. 2001-56474 to an etch stopper TFT, it is generally considered that it is required to perform the photolithography process at least seven times as a process for forming a protective insulating film over an oxide semiconductor film is newly added. This thus results in problems such as reduced productivity and increased manufacturing costs.

In the meantime, while WO2011/077607 discloses an approach for reducing a number of times to perform the photolithography process in manufacturing an LCD provided with a TFT of an etch stopper TFT, WO2011/077607 does not describe specific means for reducing the number of times to perform the photolithography process as well as manufacturing costs for LCDs or FFS-LCDs of a lateral electric field driving mode for driving liquid crystals.

Further, when a metal film (Cr, Ti, Mo, Ta, Al, Cu, and an alloy of these metals) formed into source electrodes and drain electrodes is directly formed over an oxide semiconductor film by sputtering or vacuum evaporation, even if a channel region of the oxide semiconductor film is protected by an etch stopper film (protective film), due to an interfacial reaction occurring in a source region and a drain region in which the oxide semiconductor film is electrically connected respectively to the source electrodes and the drain electrodes, there is a possibility that an influence of reduction spreads over an entire oxide semiconductor film including a channel region, thereby deteriorating the TFT properties.

SUMMARY OF THE INVENTION

The present invention provides a TFT substrate with a reduced influence from damages to a channel layer due to formation process of a source electrode and a drain electrode, without increasing a number of times of the photolithography process.

A thin film transistor substrate according to the present invention is a thin film transistor substrate having a plurality of pixels arranged in matrix, each of said pixels including a thin film transistor, said thin film transistor having: a gate electrode selectively provided over a substrate; a first insulating film covering said gate electrode; a semiconductor channel layer selectively provided on said first insulating film; a second insulating film provided on said semiconductor channel layer; a first source electrode and a first drain electrode selectively provided on said second insulating film, the first source electrode and the first drain electrode being provided with a space from each other; a second source electrode and a second drain electrode provided at least on said first source electrode and said first drain electrode, respectively, the second source electrode and the second drain electrode being provided with a space from each other; a third insulating film that covers at least said second source electrode and said second drain electrode; a third source electrode connected to said semiconductor channel layer via a first contact hole provided through said third insulating film, said second source electrode, and said first source electrode; and a third drain electrode connected to said semiconductor channel layer via a second contact hole provided through said third insulating film, said second drain electrode, and said first drain electrode; each of said pixels further including: a pixel electrode provided on said first insulating film, and extending from said second drain electrode; and a counter electrode provided on said third insulating film so as to face said pixel electrode in planar view, wherein said second source electrode, said second drain electrode, said third source electrode, said third drain electrode, and said counter electrode are made of a translucent conductive film.

According to the thin film transistor substrate of the present invention, a second insulating film is provided on a semiconductor channel layer, and therefore it is possible to prevent a channel region from being damaged when a first source electrode and a second drain electrode are formed.

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred Embodiment

<Configuration of Pixel of TFT Substrate>

Figure 1:
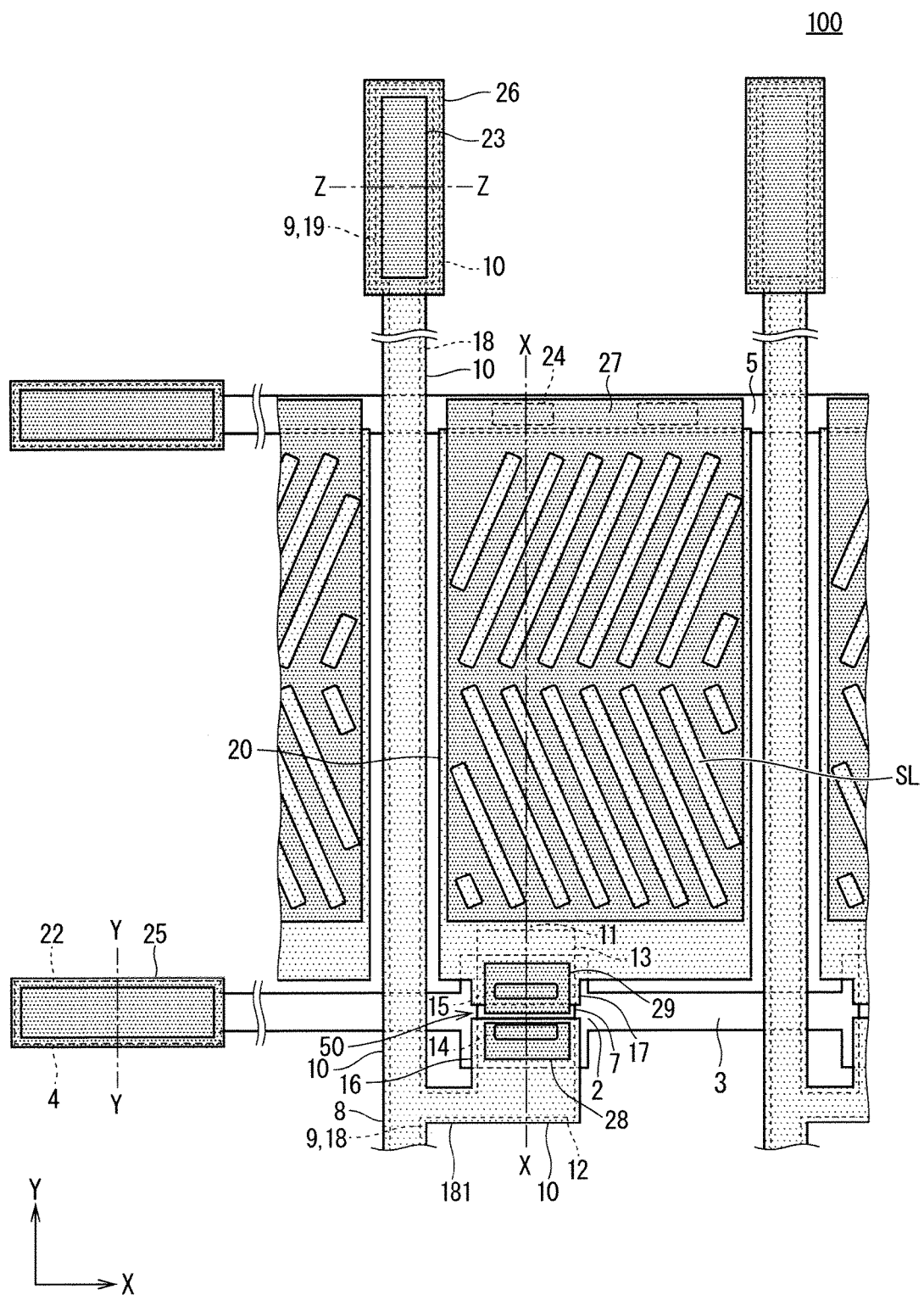
FIG. 1 is a plane view illustrating a configuration of a TFT substrate of a preferred embodiment according to the present invention.
Figure 2:
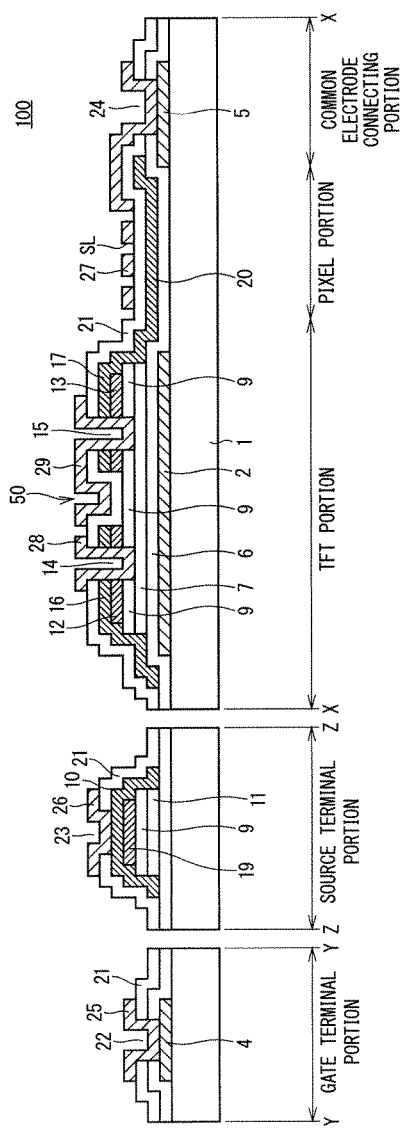
FIG. 2 shows sectional views illustrating a configuration of the TFT substrate of the preferred embodiment according to the present invention.

First, a TFT substrate 100 of this preferred embodiment will be described with reference to FIG. 1 and FIG. 2. The present invention relates to the TFT substrate, and a configuration of a pixel particularly has characteristics, so that the configuration of the pixel is described below. FIG. 1 is a plane view illustrating a planar configuration of a pixel according to this preferred embodiment, and FIG. 2 shows sectional views respectively illustrating a sectional configuration taken along line X-X in FIG. 1 (sectional configurations of a TFT portion, a pixel portion, and a common electrode connecting portion), a sectional configuration taken along line Y-Y (a sectional configuration of a gate terminal portion), and a sectional configuration taken along line Z-Z (a sectional configuration of a source terminal portion).

Here, the pixel portion includes a region where the pixel is formed, the gate terminal portion includes a region where a gate terminal 4 and a gate terminal pad 25 for supplying a gate signal to a gate wiring 3 are formed, and the source terminal portion includes a region where a source terminal 19 and a source terminal pad 26 for supplying a display signal to a source wiring 18 are formed. Further, the TFT portion includes a region where a pixel TFT 50 is formed, the pixel portion includes a region where a pixel electrode 20 and a counter electrode 27 are formed, and the common electrode connecting portion includes a region where the counter electrode 27 is connected to a common wiring 5. Hereinafter, it is described that the TFT substrate 100 is used in a light-transmissive liquid crystal display of a FFS mode.

As illustrated in FIG. 1, the TFT substrate 100 includes a plurality of gate wirings 3 (scanning signal lines) that extend along a horizontal direction (X direction) and a plurality of source wirings 18 (display signal lines) that extend along a vertical direction (Y direction), both arranged so as to orthogonally intersect each other, and the pixel TFT 50 is disposed close to each intersection point between the wirings. The gate electrode 2 of the pixel TFT 50 is constituted by a part of the gate wirings 3. Specifically, a width of the gate wiring 3 is wider in the region where the pixel TFT 50 is formed than in the other regions, and this wide portion functions as the gate electrode 2. Further, the common wiring 5 that extends along the X direction is disposed in parallel with the corresponding gate wiring 3.

A semiconductor channel layer 7 (semiconductor layer) made of oxide semiconductor is disposed on the gate electrode 2, and a first source electrode 12 and a first drain electrode 13 are disposed with a space interposed therebetween on the semiconductor channel layer 7. Further, a second source electrode 16 is disposed on the first source electrode 12, and a third source electrode 28 is disposed on second source electrode 16. Moreover, a second drain electrode 17 is disposed on the first drain electrode 13, and a third drain electrode 29 is disposed on the second drain electrode 17, and thereby the pixel TFT 50 is structured.

The third source electrode 28 is connected to the semiconductor channel layer 7 via a contact hole 14 (first contact hole), and the third drain electrode 29 is connected to the semiconductor channel layer 7 via a contact hole 15 (second contact hole). When the pixel TFT 50 is activated, a channel region is formed within the semiconductor channel layer 7 at a portion between portions with which the third source electrode 28 and the third drain electrode 29 are respectively in contact.

The first source electrode 12 is configured as a tip end of a branch wiring 181 that branches from the source wiring 18 in the X direction extending above the semiconductor channel layer 7. The first source electrode 12 forms a continuous pattern with a source wiring. Here, the first source electrode 12 and the first drain electrode 13 are made of the same material.

Further, an upper source wiring 10 is disposed so as to cover the source wiring 18 and the branch wiring 181, and a tip end of the upper source wiring 10 corresponding to a tip end of the branch wiring 181 constitutes the second source electrode 16.

Moreover, the pixel electrode 20 is provided for a pixel region surrounded by adjacent two of the gate wirings 3 and adjacent two of the source wirings 18, and a part of the pixel electrode 20 extends above the semiconductor channel layer 7 to constitute the second drain electrode 17. In addition, a part of the pixel electrode 20 overlaps a part of the common wiring 5, and an auxiliary capacitance at a pixel potential is formed at this part between the pixel electrode 20 and the common wiring 5 via an insulating film 6.

Further, the counter electrode 27 (also referred to as a common electrode) having a slit opening SL is disposed above the pixel electrode 20, and the counter electrode 27 covers the pixel electrode 20 substantially entirely and extends above the common wiring 5. Moreover, the counter electrode 27 is connected to the common wiring 5 via a contact hole 24 (third contact hole).

An end of each of the gate wirings 3 is the gate terminal 4, and connected to the gate terminal pad 25 via a contact hole 22 (fourth contact hole), and a scanning signal for video from outside is supplied to the gate terminal 4 via the gate terminal pad 25.

Similarly, an end of each of the source wirings 18 is the source terminal 19, and connected to the source terminal pad 26 via a contact hole 23 (fifth contact hole), a video signal from outside is supplied to the source terminal 19 via the source terminal pad 26. Here, the source terminal 19 is also covered by the upper source wiring 10.

Further, the all common wiring 5 is bonded electrically in a frame region that is not illustrated, and is supplied with a common potential.

Next, the sectional configuration of the pixel will be described with reference to FIG. 2. As illustrated in FIG. 2, the TFT substrate 100 is formed on a substrate 1 which is a transparent insulating substrate made of glass or plastic, for example, and a conductive film of the same material that constitutes wirings and electrodes is selectively provided on the substrate 1.

Specifically, on the substrate 1, the gate electrode 2, the gate wirings 3, the gate terminal 4, and the common wiring 5 are provided. Further, the insulating film 6 (first insulating film) is formed so as to cover these wirings and electrodes. As the insulating film 6 functions as a gate insulating film in the TFT portion, hereinafter the insulating film 6 is also referred to as the "gate insulating film 6".

Referring to the TFT portion in FIG. 2, in the region where the pixel TFT 50 is formed, the semiconductor channel layer 7 is provided so as to face the gate electrode 2 with the gate insulating film 6 interposed therebetween. Here, the semiconductor channel layer 7 is configured to have a planar pattern smaller than a planar pattern of the gate electrode 2 in planar view, an outline of the semiconductor channel layer 7 is positioned inwardly as compared to an outline of the gate electrode 2, and the semiconductor channel layer 7 is formed so as not to project from the gate electrode 2.

The semiconductor channel layer 7 is made of oxide semiconductor, and for example, made of ZnO based oxide semiconductor such as an InZnSnO based oxidized material in which indium oxide ($In_2O_3$) and tin oxide ($SnO_2$) are added to zinc oxide (ZnO), or an oxide semiconductor containing indium (In), gallium (Ga), and zinc (Zn) such as InGaZnO based oxide semiconductor in which gallium oxide ($Ga_2O_3$) and indium oxide ($In_2O_3$) are added to zinc oxide (ZnO). Oxide semiconductor has mobility higher than that of amorphous silicon, and is therefore capable of achieving small and high performance TFTs.

Further, on the semiconductor channel layer 7, an insulating film 9 (second insulating film) is provided. Here, a portion of the insulating film 9 above the channel region for the semiconductor channel layer 7 is also referred to as a protective insulating film, as this region also protects the channel region.

On the insulating film 9, the first source electrode 12 and the first drain electrode 13 are provided with a space between each other. This also applies to the second source electrode 16 and the second drain electrode 17.

The second source electrode 16 is provided so as to extend from the upper source wiring 10. The second drain electrode 17 is provided so as to extend from the pixel electrode 20. On the second source electrode 16, the second drain electrode 17, the pixel electrode 20, and the insulating film 9, an insulating film 21 (third insulating film) is formed. Between the first source electrode 12 and the first drain electrode 13 and between the second source electrode 16 and the second drain electrode 17 that are provided with spaces therebetween, the insulating film 21 is embedded.

Further, within the contact hole 14 (first contact hole) provided through the first source electrode 12, the second source electrode 16, and the insulating film 21 to reach the semiconductor channel layer 7, the third source electrode 28 is embedded so that the first source electrode 12, the second source electrode 16, and the third source electrode 28 are electrically connected to the semiconductor channel layer 7.

Moreover, within the contact hole 15 (second contact hole) provided through the first drain electrode 13, the second drain electrode 17, and the insulating film 21 to reach the semiconductor channel layer 7, the third drain electrode 29 is embedded so that the first drain electrode 13, the second drain electrode 17, the third drain electrode 29 are electrically connected to the semiconductor channel layer 7.

Furthermore, as illustrated in FIG. 2, in the gate terminal portion, the contact hole 22 (fourth contact hole) that reaches the gate terminal 4 through a laminated film of the gate insulating film 6 provided so as to cover the gate terminal 4 and the insulating film 21 is provided. The gate terminal pad 25 is embedded within the contact hole 22, and the gate terminal pad 25 is electrically connected to the gate terminal 4.

Further, as illustrated in FIG. 2, in the source terminal portion, an oxide semiconductor film 11 which is the same layer as the semiconductor channel layer 7 in the TFT portion is provided as a continuous pattern from the semiconductor channel layer 7. The insulating film 9 is provided on the oxide semiconductor film 11, and the source terminal 19 is provided on the insulating film 9. Moreover, the upper source wiring 10 is provided so as to cover the source terminal 19, the insulating film 9, and the oxide semiconductor film 11, and the insulating film 21 is provided so as to cover the upper source wiring 10. Furthermore, the contact hole 23 (fifth contact hole) that reaches the source terminal 19 through the insulating film 21 is provided. Within the contact hole 23, the source terminal pad 26 is embedded, and the source terminal pad 26 is electrically connected to the source terminal 19.

Further, while sectional configurations of the source wirings 18 and the branch wiring 181 are not explicitly illustrated in FIG. 2, the sectional configurations are generally quite similar to the sectional configuration of the source terminal 19 other than that the contact hole 23 and the source terminal pad 26 provided for the insulating film 21 are not provided. Specifically, in a region where the source wirings 18 and the branch wiring 181 are formed, the oxide semiconductor film 11 which is the same layer as the semiconductor channel layer 7 in the TFT portion is provided via the insulating film 9 entirely under the source wirings 18 and the branch wiring 181. Moreover, the upper source wiring 10 is provided so as to cover the source wirings 18 and the branch wiring 181. Here, in the region where the source wirings 18 is formed, the source wirings 18 and the oxide semiconductor film 11 are insulated by the insulating film 9. However, as the first source electrode 12 formed as a continuous pattern from the source wirings 18, and the semiconductor channel layer 7 formed as a continuous pattern from the oxide semiconductor film 11 are electrically connected in a source electrode portion in each TFT portion, the source wirings 18 and the oxide semiconductor film 11 are electrically connected to each other in the source electrode potion of the TFT portion for each pixel.

Further, as illustrated in FIG. 2, in the common electrode connecting portion, the contact hole 24 (third contact hole) that reaches the common wiring 5 through a laminated film of the gate insulating film 6 provided so as to cover the common wiring 5 and the insulating film 21 is provided. The counter electrode 27 is embedded within the contact hole 24, and the counter electrode 27 is electrically connected to the common wiring 5.

When a voltage is applied between the pixel electrode 20 and the counter electrode 27, an electric field substantially horizontal direction with a main surface of the substrate 1 may be produced above the counter electrode 27 between the counter electrode 27 and the pixel electrode 20. Here, while in this preferred embodiment, the configuration in which the counter electrode 27 is provided with the slit opening SL, it is possible to provide a comb teeth shape opening in which a plurality of slits are connected to each other on one side.

Here, while in this preferred embodiment, as a configuration for supplying a common potential to the counter electrode 27, the configuration in which the common wiring 5 which is the same layer as the gate electrode 2 or the gate wirings 3 is provided, and the common wiring 5 is connected to the counter electrode 27 via the contact hole 24 is described, it is possible to provide a configuration in which a common wiring is additionally provided in other layer. Further, it is also possible to provide a configuration in which the common wiring is omitted by connecting counter electrodes 27 with each other via a conductive oxide film of the same layer to provide a function of a common wiring for supplying a common potential. In other words, it is possible to provide a configuration in which the common wiring 5 which is provided as the same layer as the gate electrode 2 or the gate wirings 3 and the contact hole 24 for connecting the counter electrode 27 to the common wiring 5 are omitted.

<Manufacturing Method>

Next, a method for manufacturing the TFT substrate of the preferred embodiment according to the present invention will be described with reference to FIGS. 3-16. Here, FIGS. 3, 8, 11, and 14 are plane views corresponding to FIG. 1, and FIGS. 4-7, 9, 10, 12, 13, 15, and FIG. 16 are sectional views corresponding to FIG. 2. A final step will be described with reference to FIG. 1 and FIG. 2.

First, the substrate 1 as a transparent insulating substrate such as glass is cleaned using cleaning liquid or pure water. Here, in this preferred embodiment, a 0.5-mm thick glass substrate is used as the substrate 1.

Then, a conductive film (first conductive film) which is a material of the gate electrode 2, the gate wirings 3, and the like is formed on one main surface of the substrate 1. Examples of a material of the first conductive film that can be used include metals such as chromium (Cr), molybdenum (Mo), titanium (Ti), copper (Cu), tantalum (Ta), tungsten (W), and aluminium (Al), and an alloy containing an element of the above metal element as a main component with addition of one or more other elements. Here, a main component element is referred to an element having a largest content among elements that constitute an alloy. Further, it is possible to provide a laminated structure in which two or more layers of these metals and the alloy is included. By using these metals and the alloy, it is possible to achieve a low-resistance conductive film having a specific resistance as low as 50 $\mu\Omega$cm or lower.

In this preferred embodiment, an aluminium (Al) alloy film is used as the first conductive film, an Al alloy film is formed into a 200-nm thick film by sputtering using an argon (Ar) gas.

<First Photolithography Process>

Thereafter, a photoresist material is applied on the first conductive film. A photoresist pattern is formed in a first photolithography process, and the first conductive film is patterned by etching using the photoresist pattern as a mask. Here, wet etching using a solution containing phosphoric acid, acetic acid, and nitric acid (PAN chemical) is employed. Then, by removing the photoresist pattern, the gate electrode 2, the gate wirings 3 (not illustrated in FIG.

Figure 3:
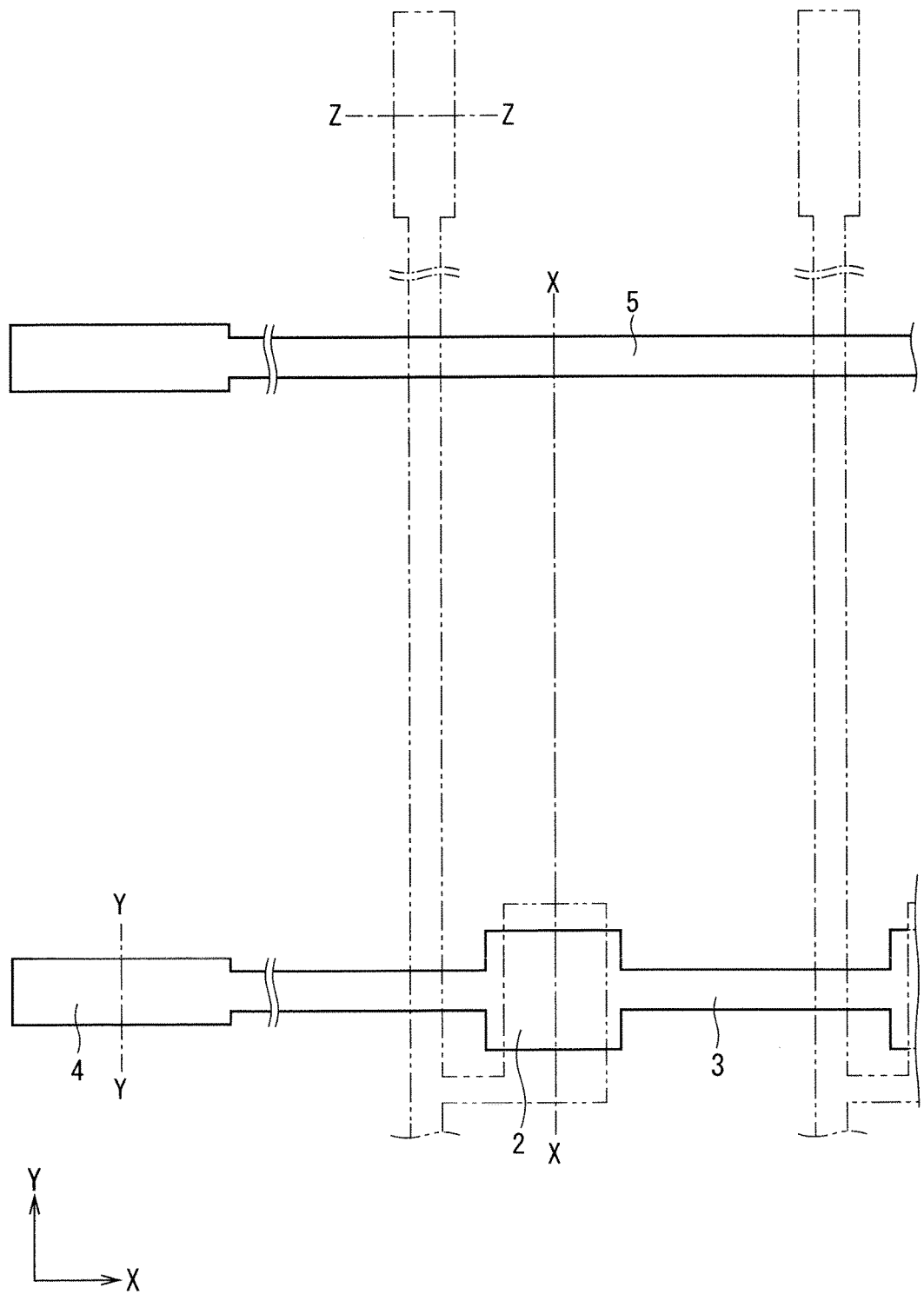
FIG. 3 is a plane view illustrating a method for manufacturing the TFT substrate of the preferred embodiment according to the present invention.
Figure 4:
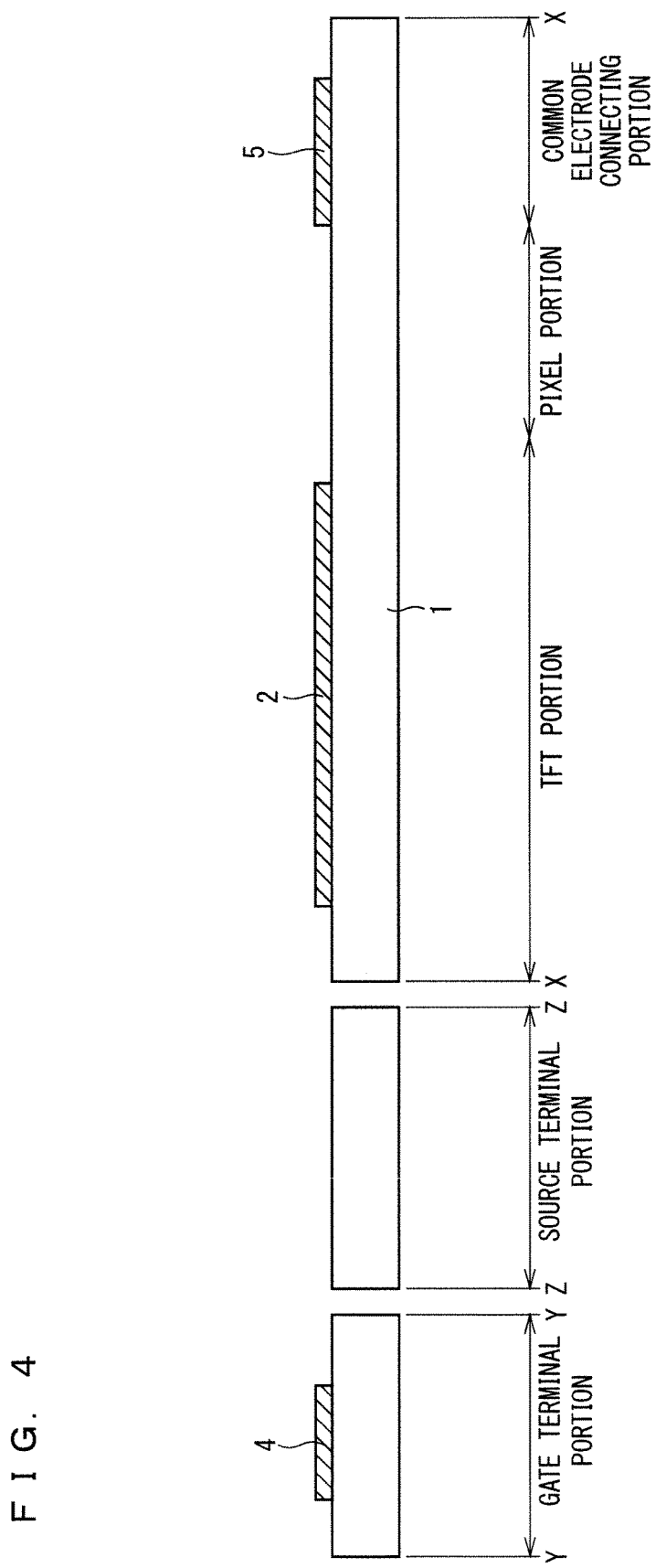
FIGS. 4, 5, 6, and 7 are sectional views each illustrating a method for manufacturing the TFT substrate of the preferred embodiment according to the present invention.

4), the gate terminal 4, and the common wiring 5 are formed on the one main surface of the substrate 1, as illustrated in FIG. 3 and FIG. 4.

Figure 5:
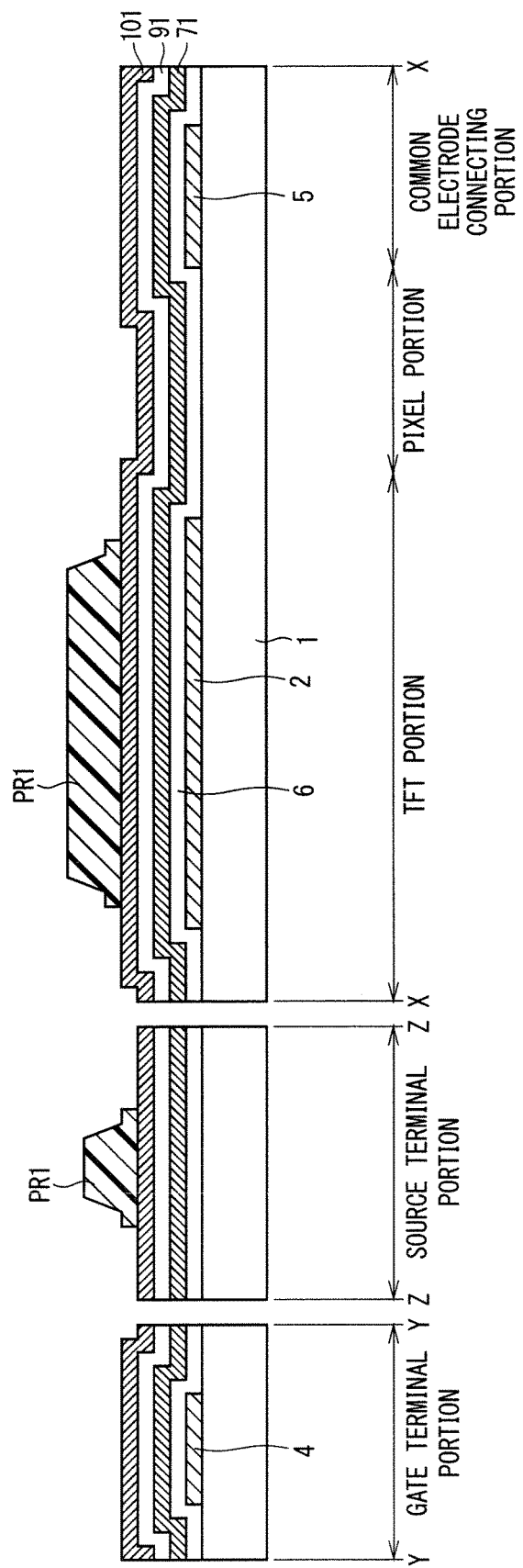

Next, in a step shown in FIG. 5, the insulating film 6 (first insulating film) is formed entirely on the one main surface of the substrate 1 so as to cover the gate electrode 2 and the like. In this preferred embodiment, chemical vapor deposition (CVD) is used to form a laminated film, as the insulating film 6, in which a 50-nm thick silicon oxide (SiO) film is laminated on a 400-nm thick silicon nitride (SiN) film.

Here, as the silicon oxide film only has a low barrier property (blocking property) against impurity elements that influence TFT properties such as, moisture ($H_2O$), hydrogen ($H_2$), natrium (Na), and potassium (K), it is possible to expect a barrier effect against an impurity element by providing a SiN film having a superior barrier property under the silicon oxide film.

Thereafter, an oxide semiconductor film 71 as a material of the semiconductor channel layer 7 is formed on the insulating film 6. In this preferred embodiment, an oxidized material containing In, Ga, and Zn, for example, InGaZnO is used as the oxide semiconductor. Specifically, the oxide semiconductor film 71 made of a 50-nm thick InGaZnO film is formed by sputtering using an InGaZO target whose atomic composition ratio is In:Ga:Zn:O is 1:1:1:4 ($In_2O_3$—$Ga_2O_3$—$(ZnO)_2$). With this method, an oxide film in an oxygen ion deficient state in which an atomic composition ratio of oxygen is smaller than a stoicheiometric composition (in the above example, a composition ratio of O is lower than 4) is easily formed. Therefore, it is desirable to perform sputtering by mixing an oxygen ($O_2$) gas into Ar gas. Here, sputtering is performed using a mixture gas in which an $O_2$ gas whose partial pressure ratio is 10% with respect to Ar gas is added. This InGaZnO film has an amorphous structure. In addition, a typical crystallization temperature of an InGaZnO film of an amorphous structure is 500° C. (degrees Celsius) or higher, and therefore at an ordinary temperature, most part of the InGaZnO film remain stable in the amorphous structure.

Next, an insulating film 91 (second insulating film) is formed on the oxide semiconductor film 71. In this preferred embodiment, as the insulating film 91, an SiO film is formed using CVD method.

Next, a conductive film 101 (second conductive film) is formed on the insulating film 91. In this preferred embodiment, a laminated film of a molybdenum alloy film and an aluminium alloy film, in which a very small amount of another element is added to molybdenum (Mo) and aluminium (Al), respectively, are provided as the conductive film 101.

<Second Photolithography Process>

A photoresist material is applied on a laminated film of the oxide semiconductor film 71, the insulating film 91, and the conductive film 101 laminated on the insulating film 6 in the above manner. A photoresist pattern PR1 is formed in a second photolithography process, and the laminated film is patterned by sequentially etching using the photoresist pattern PR1 as a mask.

As illustrated in FIG. 5, the photoresist pattern formed here is the photoresist pattern PR1 formed in a region where the semiconductor channel layer 7 is formed and a region where the source terminal 19 and the source wirings 18 (not illustrated) is formed. Here, by performing halftone exposure when the photoresist pattern PR1 is formed, the photoresist pattern PR1 is formed to be thick at a central portion and thinner at a peripheral portion than the central portion.

Next, the conductive film 101 is etched using the photoresist pattern PR1 as a mask. Wet etching using a PAN chemical may be employed for the etching. Here, etching is performed using a PAN chemical containing phosphoric acid 70 wt %, acetic acid 7 wt %, nitric acid 5 wt %, and water. At this stage, the oxide semiconductor film 71 may not be damaged by the chemical as being covered by the insulating film 91.

Figure 6:
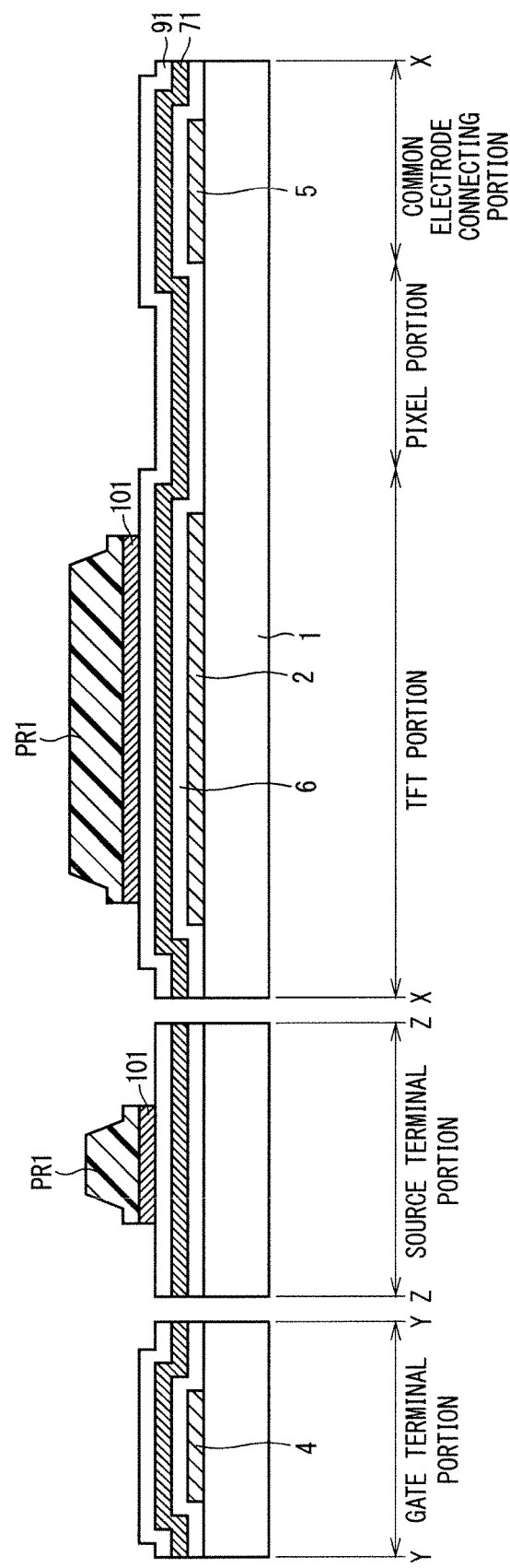

FIG. 6 shows a stage in which the conductive film 101 of a portion that is not covered by the photoresist pattern PR1 is etched, and the conductive film 101 remains at the region where the semiconductor channel layer 7 is formed, and the region where the source terminal 19 and the source wirings 18 (not illustrated) are formed.

Next, by etching the insulating film 91 using the photoresist pattern PR1 as a mask, the insulating film 91 of the portion that is not covered by the photoresist pattern PR1 and the conductive film 101 is etched, and the insulating film 91 remains at the region where the semiconductor channel layer 7 is formed and the region where the source terminal 19 and the source wirings 18 (not illustrated) are formed. Dry etching using a gas containing fluorine may be employed for the etching. In this preferred embodiment, a gas in which oxygen ($O_2$) is added to sulfur hexafluoride ($SF_6$) is used to perform dry etching. By adding an $O_2$ gas, it is possible to prevent the oxide semiconductor film 71 under the insulating film 91 from being damaged by a reduction reaction when etching.

Next, by etching the oxide semiconductor film 71 using the photoresist pattern PR1 as a mask, the oxide semiconductor film 71 of the portion that is not covered by the photoresist pattern PR1, the conductive film 101, and the insulating film 91 is etched, and the oxide semiconductor film 71 remains at the region where the semiconductor channel layer 7 is formed and the region where the source terminal 19 and the source wirings 18 (not illustrated) are formed. Wet etching using a chemical containing carboxylic acid may be employed for the etching. As the chemical containing carboxylic acid, it is desirable to use a chemical containing oxalic acid from 1 wt % to 10 wt %. In this preferred embodiment, a chemical containing 5 wt % of oxalic acid and water is used.

Figure 7:
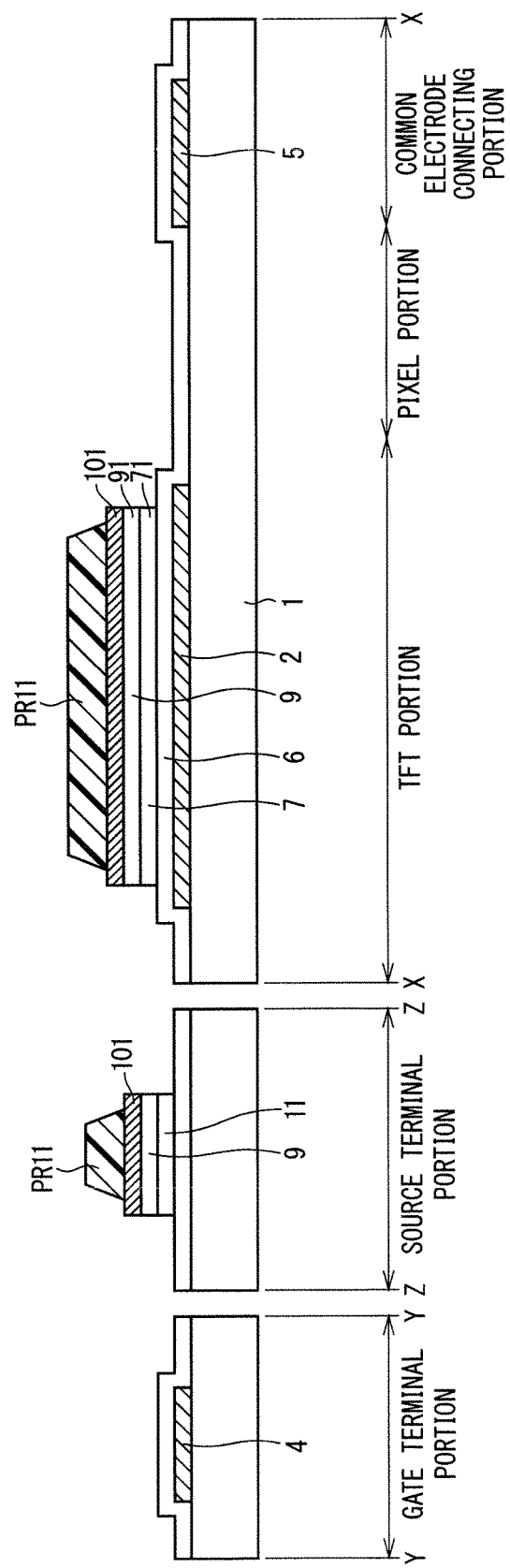

Thereafter, by performing oxygen ashing to decrease an overall thickness of the photoresist pattern PR1, as illustrated in FIG. 7, the thin peripheral portion is entirely removed, and the thick central portion is made thinner and remains as a photoresist pattern PR11.

Figure 8:
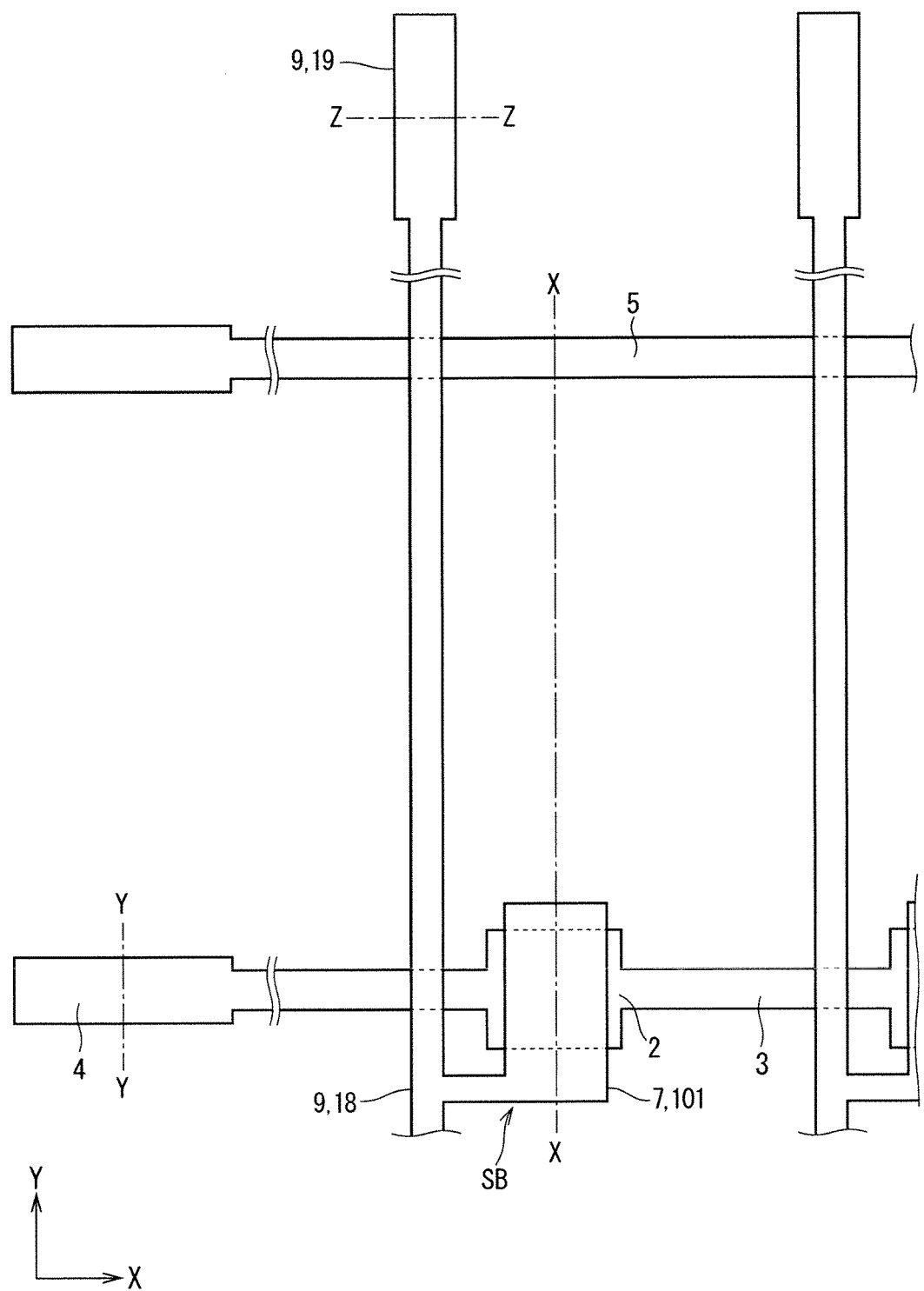
FIG. 8 is a plane view illustrating a method for manufacturing the TFT substrate of the preferred embodiment according to the present invention.
Figure 9:
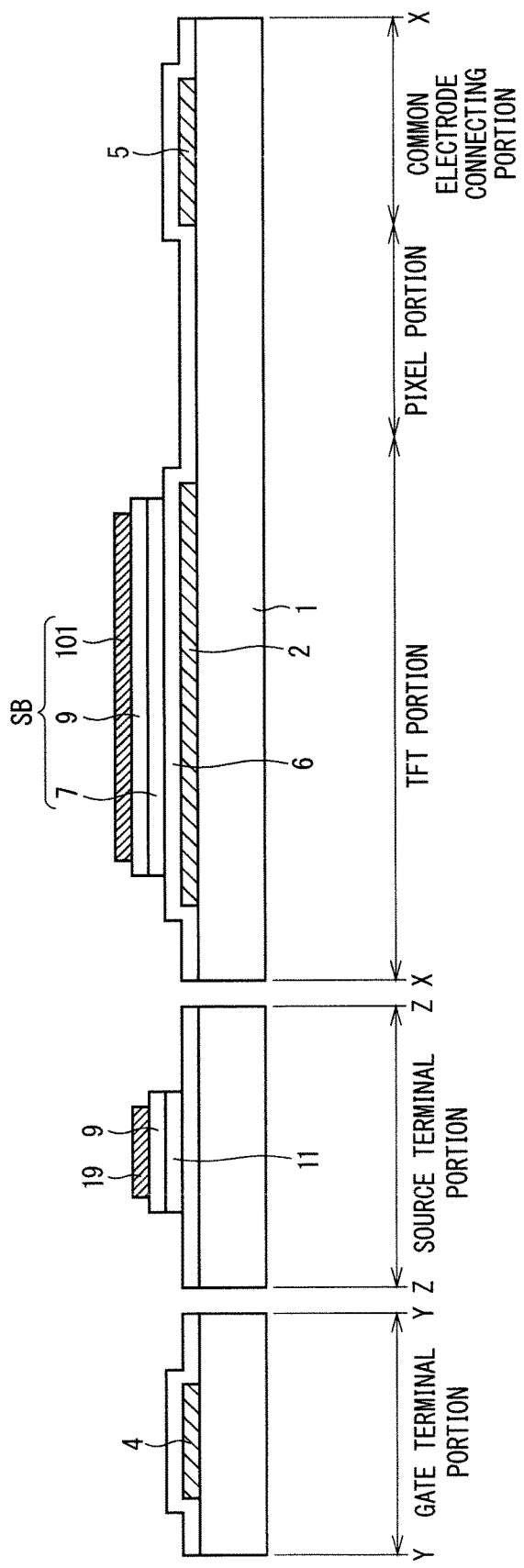
FIGS. 9 and 10 are sectional views each illustrating a method for manufacturing the TFT substrate of the preferred embodiment according to the present invention.

Next, by removing the photoresist pattern PR11 after the conductive film 101 is etched again using the remaining photoresist pattern PR11 as a mask, as illustrated in FIG. 8 and FIG. 9, a laminated body SB in which the semiconductor channel layer 7, the insulating film 9, and the conductive film 101 are laminated may be obtained in the TFT portion. Here, the conductive film 101 is not in directly contact with the semiconductor channel layer 7. Further, in the source terminal portion, the conductive film 101 remains above the oxide semiconductor film 11, which is made of the same material and in the same layer as the semiconductor channel layer 7, with the insulating film 9 interposed therebetween to constitute the source terminal 19. Here, as illustrated in FIG. 8, the conductive film 101 also remains as the source wirings 18 and the branch wiring 181. While wet etching using a PAN chemical is employed in this etching, the oxide semiconductor film 71 may not be damaged by the chemical as the insulating film 91 remains above the oxide semiconductor film 71.

It should be noted that, a planar pattern of the conductive film 101 remaining at the TFT portion by etching the conductive film 101 again using the photoresist pattern PR11 as a mask is smaller than a planar pattern of the semiconductor channel layer 7 in planar view, and an outline of the conductive film 101 is positioned more inwardly than an outline of the semiconductor channel layer 7. Further, also in the source terminal portion, a planar pattern of the source terminal 19 is smaller than a planar pattern of the oxide semiconductor film 11 in planar view, and an outline of the source terminal 19 is positioned more inwardly than an outline of the oxide semiconductor film 11. This also applies to the source wirings 18 and the branch wiring 181. In FIG. 8, for descriptive purposes, the outline of the conductive film 101 and the outline of the semiconductor channel layer 7 are illustrated to be the same. This also applies to the source terminal 19 and the oxide semiconductor film 11 under the source terminal 19, as well as to the source wirings 18 and the branch wiring 181 and the oxide semiconductor film 11 under the source wirings 18 and the branch wiring 181.

Figure 10:
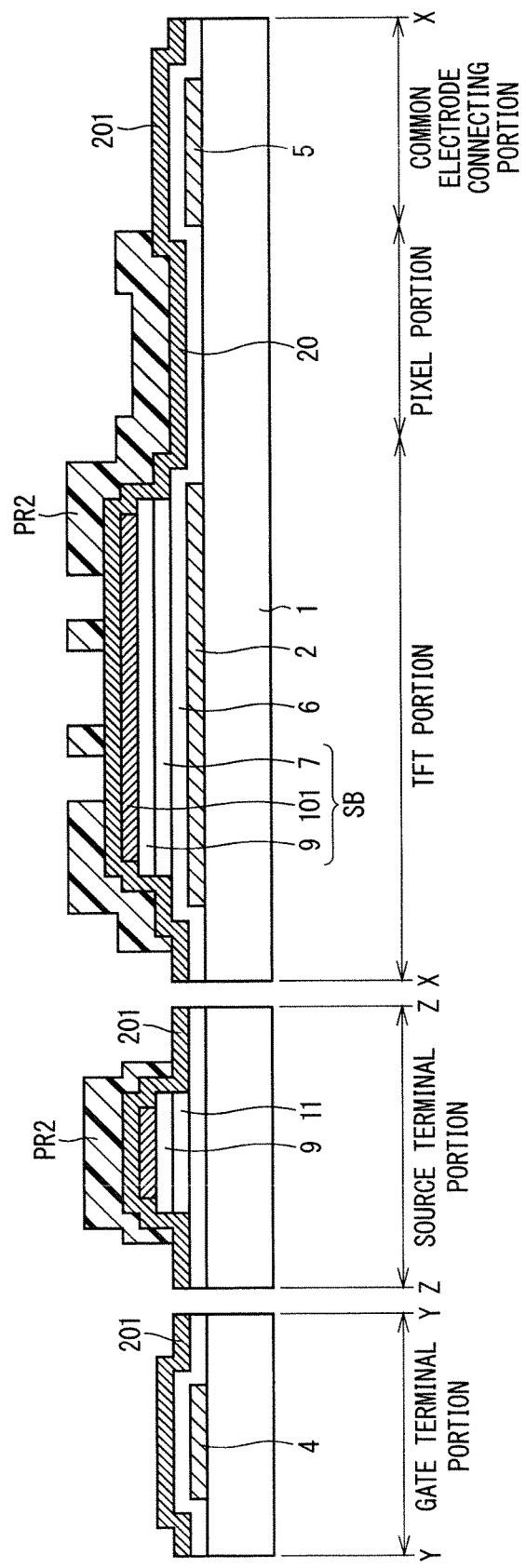

Next, in a step shown in FIG. 10, a conductive film 201 (third conductive film) is formed so as to cover the laminated body SB. In this preferred embodiment, a transparent conductive film (translucent conductive film) is used as the conductive film 201. As the transparent conductive film, ITO is used as a conductive oxide film (a mixture ratio of indium oxide ($In_2O_3$) and tin oxide ($SnO_2$) is 90:10 (weight %), for example). In this example, a 100-nm thick ITO film is formed in an amorphous state by sputtering, using a gas containing hydrogen (H) in argon (Ar), for example, a mixture gas such as a hydrogen ($H_2$) gas or moisture vapor ($H_2O$).

<Third Photolithography Process>

A photoresist material is applied on the conductive film 201 that is formed in this manner. A photoresist pattern is formed in a third photolithography process, and the conductive film 201 is patterned by etching using this photoresist pattern as a mask.

As illustrated in FIG. 10, the photoresist pattern formed here is a photoresist pattern PR2 formed in the TFT portion, the pixel portion, and the source terminal portion. Here, the photoresist pattern PR2 is also formed in the region where the source wirings 18 that is not illustrated is formed. Wet etching using a chemical containing 5 wt % of oxalic acid and water is employed for the etching.

Thereafter, the conductive film 101 on the insulating film 9 is patterned by etching using the photoresist pattern PR2 and the conductive film 201 under the photoresist pattern PR2 after patterning as a mask.

Wet etching using a PAN chemical containing 70 wt % of phosphoric acid, 7 wt % of acetic acid, 5 wt % of nitric acid, and water is employed for the etching. Here, the semiconductor channel layer 7 may not be damaged by the chemical as being covered by the insulating film 9.

By a series of etching, the source electrode and the drain electrode are electrically separated entirely, and the contact holes reaching the insulating film 9 are respectively provided on a side of the source electrode and on a side of the drain electrode.

Figure 11:
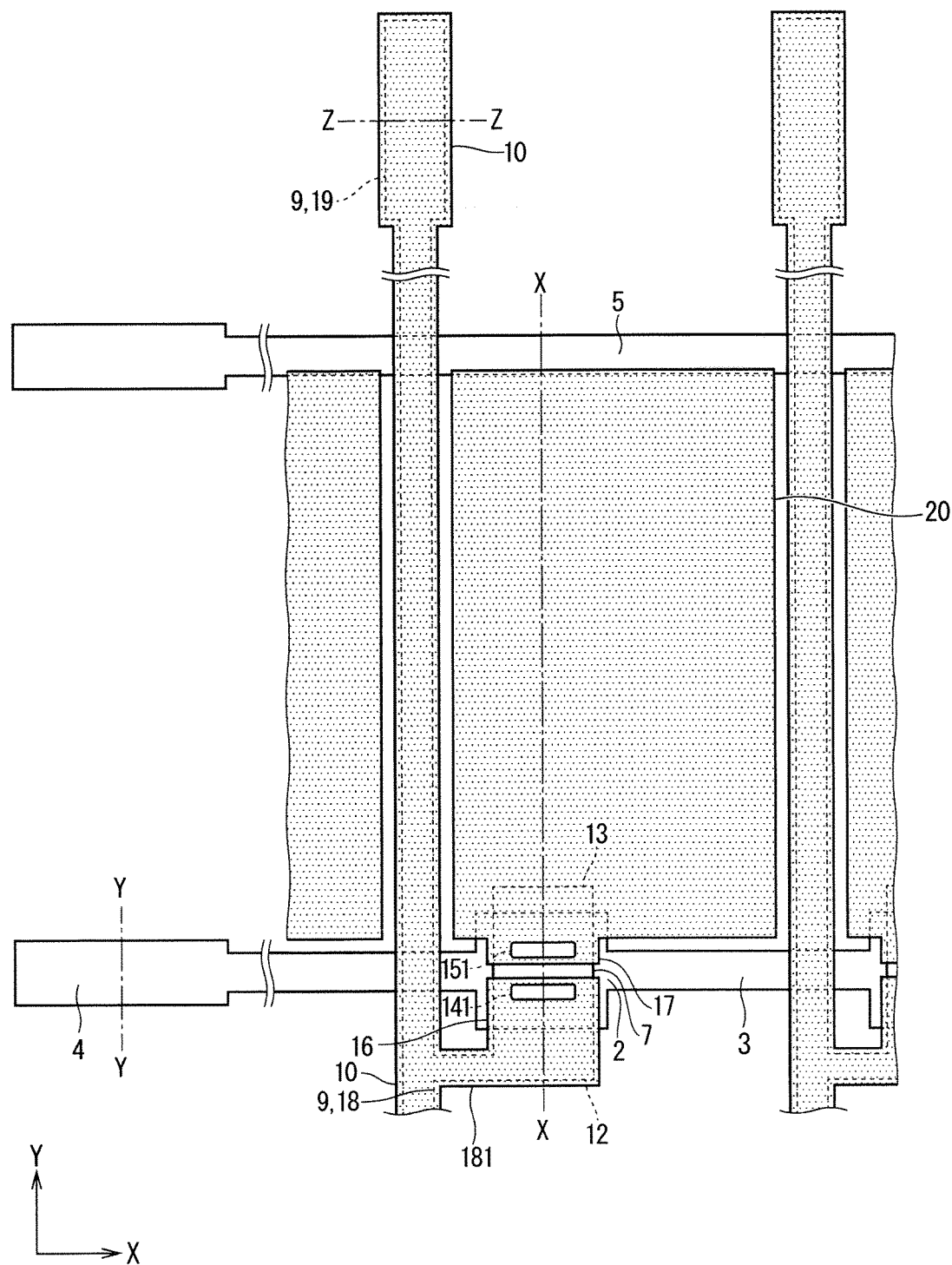
FIG. 11 is a plane view illustrating a method for manufacturing the TFT substrate of the preferred embodiment according to the present invention.
Figure 12:
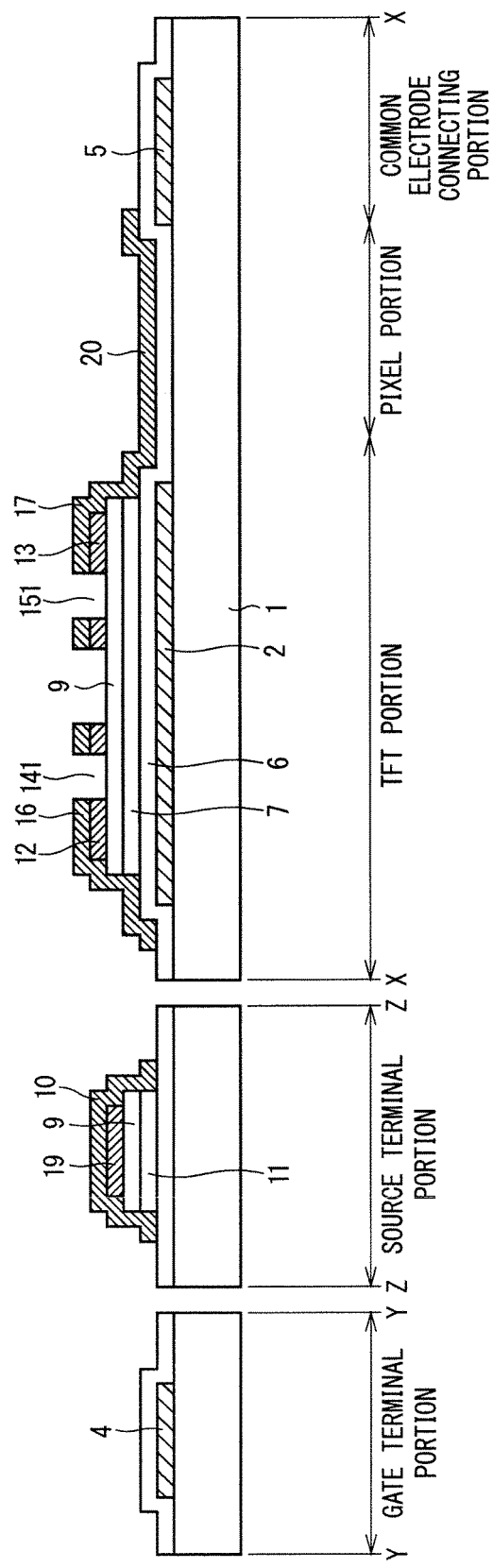
FIGS. 12 and 13 are sectional views each illustrating a method for manufacturing the TFT substrate of the preferred embodiment according to the present invention.

Thereafter, by removing the photoresist pattern PR2, as illustrated in FIG. 11 and FIG. 12, the first source electrode 12 and the first drain electrode 13 are formed with a space between each other on the semiconductor channel layer 7, the second source electrode 16 is formed on the first source electrode 12, and the second drain electrode 17 is formed on the first drain electrode 13. Further, a source contact hole 141 that reaches the insulating film 9 is provided on the side of the source electrode, a drain contact hole 151 that reaches the insulating film 9 is provided on the side of the drain electrode.

Here, as illustrated in FIG. 11, the second drain electrode 17 is formed integrally with the pixel electrode 20 that is formed in the pixel portion, and the second source electrode 16 is formed integrally with the upper source wiring 10 that is formed on the source terminal 19, the source wirings 18, and the branch wiring 181.

Figure 13:
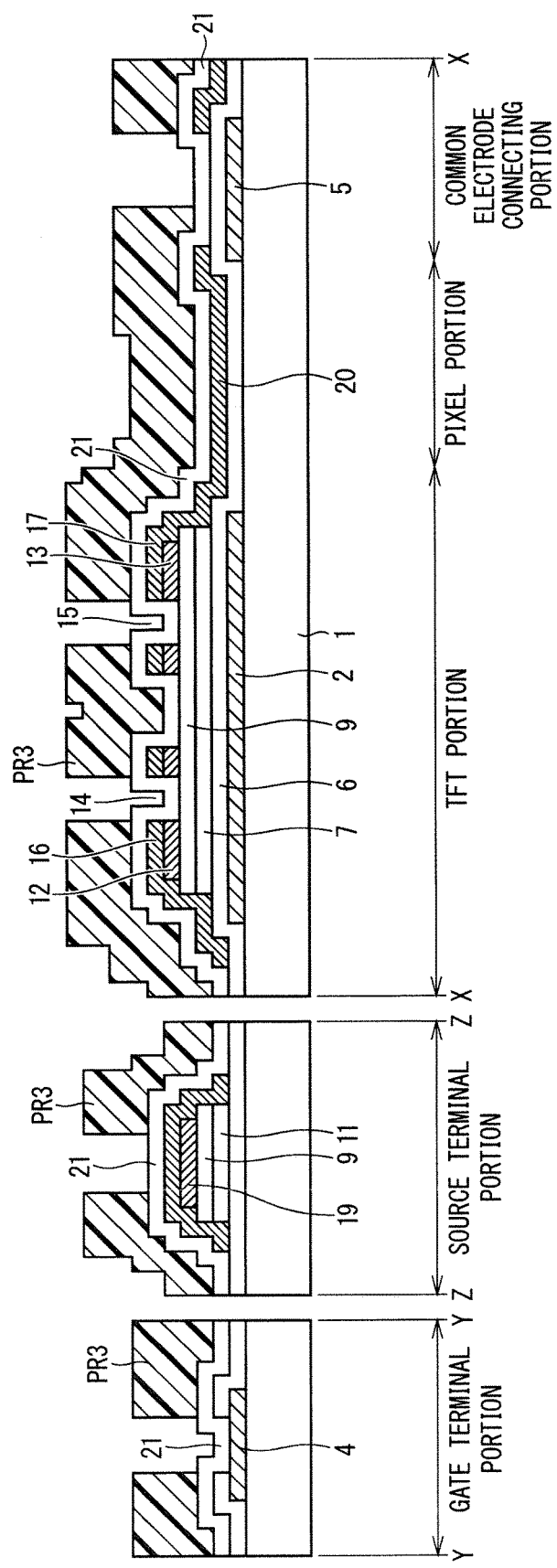

Next, as illustrated in FIG. 13, the insulating film 21 (third insulating film) is formed over the substrate 1 over which the second source electrode 16, the second drain electrode 17, the pixel electrode 20, and the upper source wiring 10 are formed. In this preferred embodiment, CVD method is used to form a laminated film, as the insulating film 21, in which a 100-nm thick SiN film is laminated on a 200-nm thick SiO film.

As the silicon oxide film only has a low barrier property (blocking property) against impurity elements that influence TFT properties such as, moisture ($H_2O$), hydrogen ($H_2$), natrium (Na), and potassium (K), it is possible to expect a barrier effect against an impurity element entering from outside by providing a SiN film having a superior barrier property on the silicon oxide film.

<Fourth Photolithography Process>

A photoresist material is applied on the insulating film 21 that is formed in this manner. A photoresist pattern PR3 is formed in a fourth photolithography process, and the insulating film 21, the insulating film 9, and the insulating film 6 are etched using the photoresist pattern PR3 as a mask. Dry etching using a gas containing fluorine may be employed for the etching. In this preferred embodiment, a gas in which oxygen ($O_2$) is added to sulfur hexafluoride ($SF_6$) is used to perform dry etching. By adding an $O_2$ gas, it is possible to prevent the semiconductor channel layer 7 under the insulating film 9 from being damaged by a reduction reaction when etching.

Figure 14:
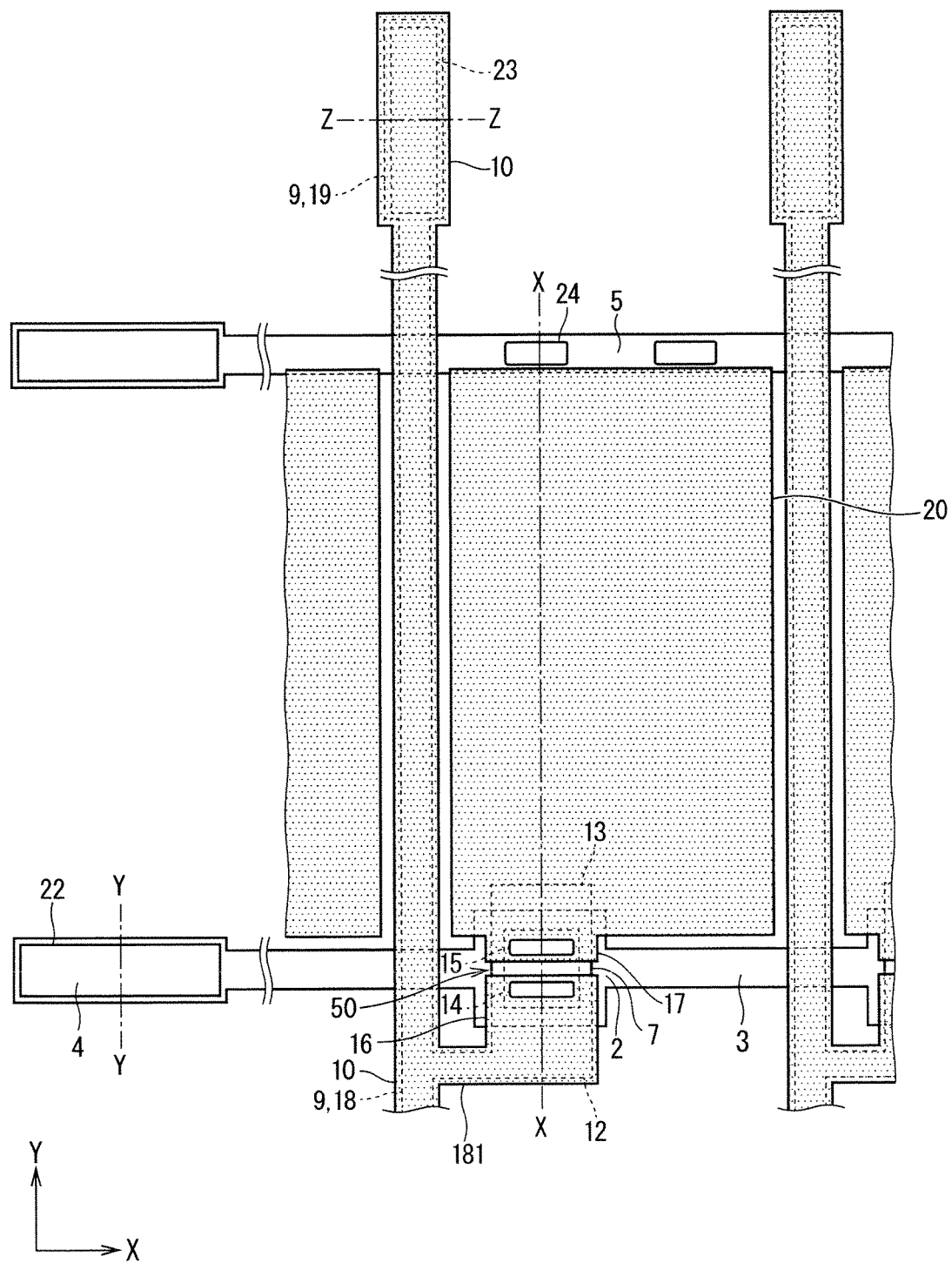
FIG. 14 is a plane view illustrating a method for manufacturing the TFT substrate of the preferred embodiment according to the present invention.
Figure 15:
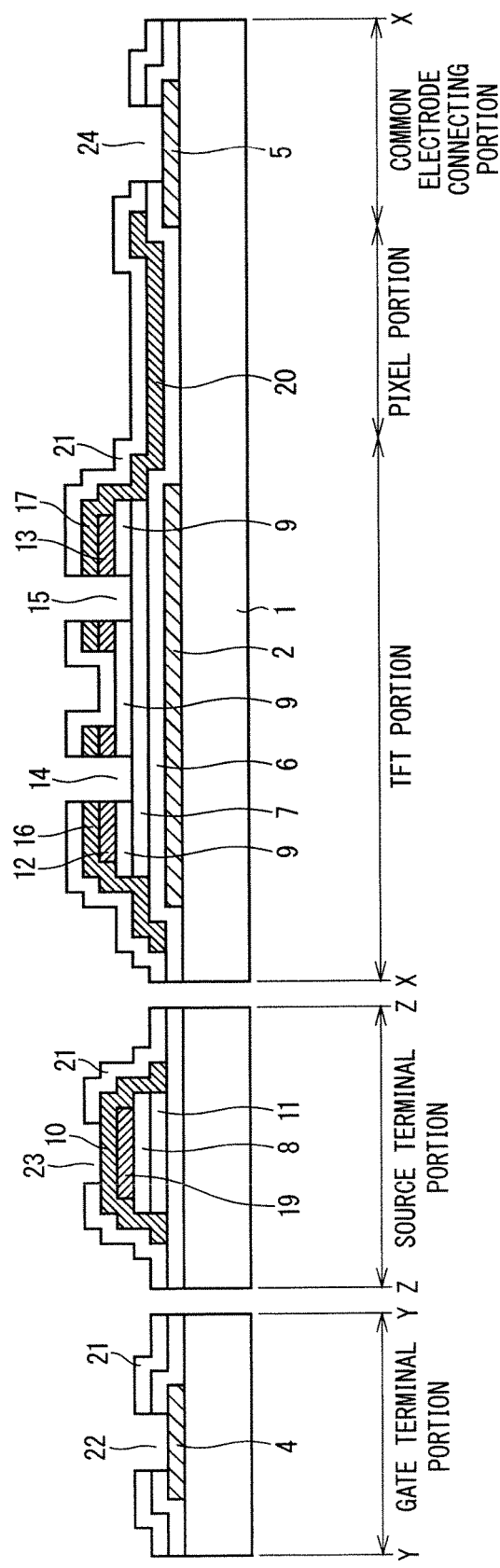
FIGS. 15 and 16 are sectional views each illustrating a method for manufacturing the TFT substrate of the preferred embodiment according to the present invention.

Thereafter, as illustrated in FIG. 14 and FIG. 15, by removing the photoresist pattern PR3, in the TFT portion, the contact hole 14 (first contact hole) that reaches the semiconductor channel layer 7 through the insulating film 21 and the insulating film 9 is provided on the side of the source electrode, the contact hole 15 (second contact hole) that reaches the semiconductor channel layer 7 through the insulating film 21 and the insulating film 9 is provided on the side of the drain electrode. Further, in the gate terminal portion, the contact hole 22 (fourth contact hole) that reaches the gate terminal 4 through the insulating film 21 and the insulating film 6 is provided. Moreover, in the source terminal portion, the contact hole 23 (fifth contact hole) that reaches the upper source wiring 10 through the insulating film 21 is provided. Furthermore, in the common electrode connecting portion, the contact hole 24 (third contact hole) that reaches the common wiring 5 through the insulating film 21 and the insulating film 6 is provided.

Figure 16:
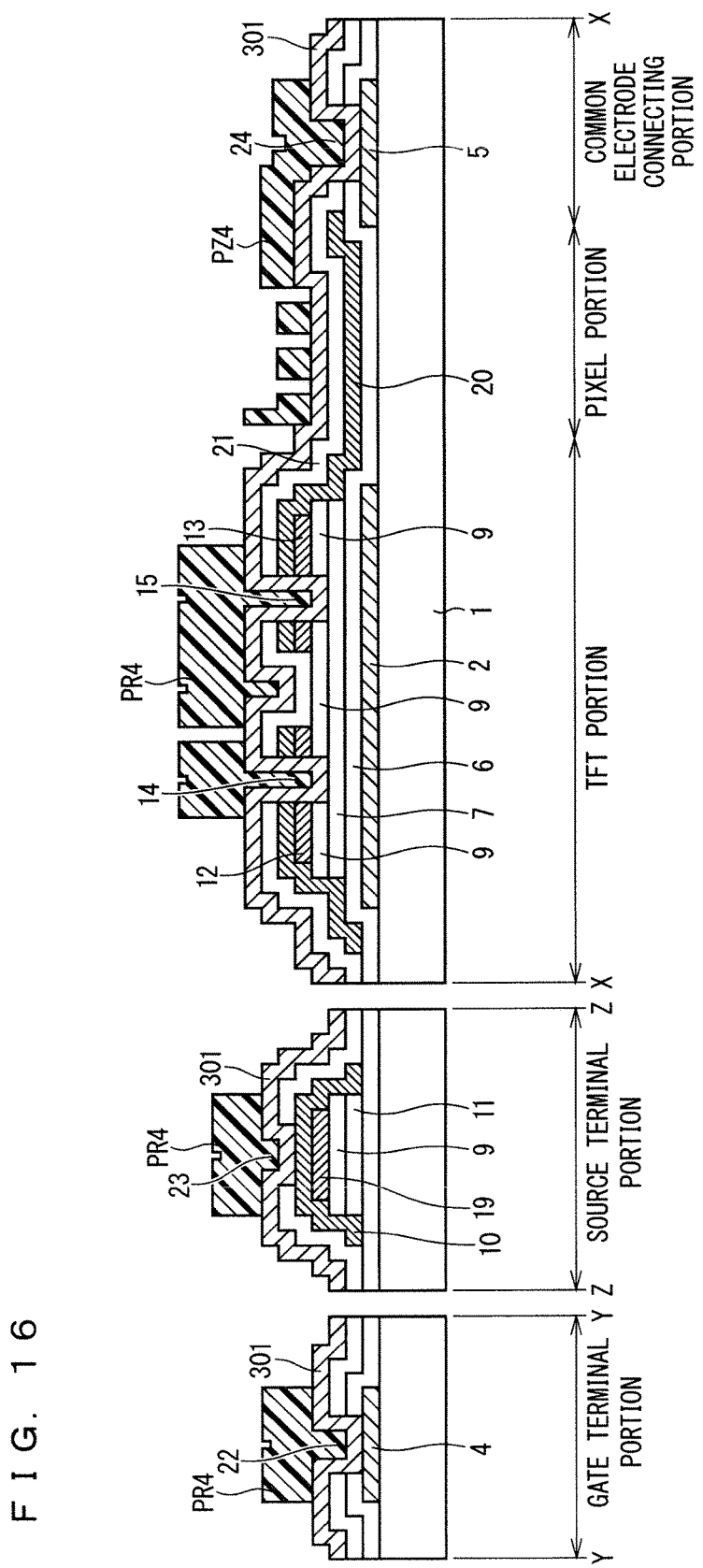

Next, in a step shown in FIG. 16, a conductive film 301 (third conductive film) is formed entirely over the one main surface of the substrate 1. In this preferred embodiment, a transparent conductive film (translucent conductive film) is used as the conductive film 301. As the transparent conductive film, ITO is used (a mixture ratio of indium oxide ($In_2O_3$) and tin oxide ($SnO_2$) is 90:10 (weight %), for example). In this example, a 100-nm thick ITO film is formed in an amorphous state by sputtering, using a gas containing hydrogen (H) in argon (Ar), for example, a mixture gas such as a hydrogen ($H_2$) gas or moisture vapor ($H_2O$).

<Fifth Photolithography Process>

A photoresist material is applied on the conductive film 301 that is formed in this manner. A photoresist pattern is formed in a fifth photolithography process, and the conductive film 301 is patterned by etching using this photoresist pattern as a mask.

As illustrated in FIG. 16, the photoresist pattern formed here is a photoresist pattern PR4 formed in the TFT portion, the pixel portion, the common electrode connecting portion, the gate terminal portion, and the source terminal portion.

Wet etching using a chemical containing 5 wt % of oxalic acid and water is employed for the etching.

Thereafter, by removing a photoresist pattern PR5, like the TFT substrate 100 illustrated in FIG. 1 and FIG. 2, the third source electrode 28 electrically connecting the semiconductor channel layer 7 with the first source electrode 12 and the second source electrode 16 via the contact hole 14 that reaches the semiconductor channel layer 7 is formed, and the third drain electrode 29 electrically connecting the semiconductor channel layer 7 with the first drain electrode 13 and the second drain electrode 17 via the contact hole 15 that reaches the semiconductor channel layer 7 is formed. Here, the photoresist pattern PR5 is configured such that the third drain electrode 29 provides a pattern extending above the channel region.

Further, the gate terminal pad 25 electrically connected to the gate terminal 4 via the contact hole 22 that reaches the gate terminal 4, the source terminal pad 26 electrically connected to the source terminal 19 via the contact hole 23 that reaches the upper source wiring 10, and the counter electrode 27 having the slit opening SL and electrically connected to the common wiring 5 via the contact hole 24 that reaches the common wiring 5 are formed.

Here, the third source electrode 28 for electrically connecting the first source electrode 12 and the second source electrode 16 to the semiconductor channel layer 7 is directly connected to the semiconductor channel layer 7, the third drain electrode 29 for electrically connecting the first drain electrode 13 and the second drain electrode 17 to the semiconductor channel layer 7 is directly connected to the semiconductor channel layer 7. However, as the third source electrode 28 and the third drain electrode 29 are made of an oxidized material based conductive film (conductive oxide film) such as ITO, the third source electrode 28 and the third drain electrode 29 may not reduce surfaces of the source region and the drain region of the semiconductor channel layer 7, and therefore it is possible to suppress an influence of deterioration of properties of the semiconductor channel layer 7. Thus, the TFT substrate 100 for a FFS mode liquid crystal display and having a configuration as illustrated in FIG. 1 and FIG. 2 is completed.

When a liquid crystal display panel is assembled, an alignment film and spacers are formed on a surface of the finished TFT substrate 100. The alignment film is a film for aligning liquid crystals and is made of polyimide or the like. A counter substrate that is manufactured separately and includes a color filter, a counter electrode, and the alignment film is bonded to the TFT substrate 100. At this time, the spacers create a gap between the TFT substrate and the counter substrate, and the liquid crystals are injected into the gap and sealed, to thereby form a FFS-mode liquid crystal display panel. Finally, a polarizing plate, a phase difference plate, a driving circuit, and a backlight unit are disposed outside the liquid crystal display panel, to thereby complete a liquid crystal display.

<Effects>

As described above, according to the TFT substrate 100 of this preferred embodiment, an oxide semiconductor film is used for the semiconductor channel layer 7 of the TFT, the insulating film 9 for protecting the semiconductor channel layer 7 is provided under the first source electrode 12 and the first drain electrode 13 that constitute the source electrode and the drain electrode. Therefore, it is possible to prevent damages from occurring during processing of the source electrode and the drain electrode made of a metal or an alloy. Therefore, a high performance TFT substrate for FFS-LCD may be manufactured with high productivity by performing a photolithography process five times.

Further, as the semiconductor channel layer 7 is electrically connected with the first source electrode 12 and the second source electrode 16 using the third source electrode 28 made of an ITO film, and as the semiconductor channel layer 7 is electrically connected with the first drain electrode 13 and the second drain electrode 17 using the third drain electrode 29 made of an ITO film, contacting properties of interfaces between the semiconductor channel layer 7 and the source electrode, and the semiconductor channel layer 7 and the drain electrode are improved, and an on current value and a mobility value are improved, and thus it is possible to provide TFT properties for higher performance.

Moreover, as a part of the pattern of the third drain electrode 29 extends above the channel region to provide a shield of an ITO film above the channel region, it is possible to prevent light from a front side of the TFT substrate 100 (an opposite side of the substrate 1) from entering the semiconductor channel layer 7, and thus to provide TFT properties for higher performance. Here, by causing the third source electrode 28 to extend above the channel region in place of the third drain electrode 29 may provide the same effect.

Furthermore, as the insulating film 9 is formed on the semiconductor channel layer 7, it is possible to prevent electrical short circuit from occurring between the gate electrode 2 and the first source electrode 12.

Further, as a common photoresist pattern is used for patterning the semiconductor channel layer 7 constituted by an oxide semiconductor film containing In, Ga, and Zn, the insulating film 9 having a silicon oxide film, the first source electrode 12, and the first drain electrode 13, and as a common photoresist pattern is used for patterning the first source electrode 12 and the second source electrode 16, the first drain electrode 13 and the second drain electrode 17, and the source contact hole 141 and the drain contact hole 151, it is possible to manufacture the TFT substrate 100 by performing the photolithography process five times using five masks, an increase of manufacturing costs may be reduced.

Moreover, as the oxide semiconductor film 11 which is the same layer as the semiconductor channel layer 7 is provided entirely below the source wirings 18, and as the source wirings 18 and the oxide semiconductor film 11 are electrically connected in the TFT portion for each pixel, it is possible to reduce occurrence of line defect in connection due to disconnection of the source wirings 18 because the source wirings 18 becomes so-called redundant wiring.

Furthermore, as an auxiliary capacitance at a pixel potential is formed at a portion where the pixel electrode 20 overlaps the common wiring 5, it is possible to increase a margin for leakage of a display signal potential applied to the pixel electrode 20. With this, it is possible to reduce display defect due to a defect in holding a signal potential, and to achieve a high quality liquid crystal display.

Further, the semiconductor channel layer 7 is formed to be smaller than the planar pattern of the gate electrode 2 in planar view, so as not to extend from the gate electrode 2. With this, when the TFT substrate 100 is mounted on a light transmissive liquid crystal display, light irradiated from a backlight unit to a back side of the TFT substrate 100 (a back side of the substrate 1) is shielded by the pattern of the gate electrode 2, suppressing light directly entering the semiconductor channel layer 7. As a result, it is possible to suppress deterioration of TFT properties due to light irradiation.

As described above, the TFT substrate 100 according to this preferred embodiment improves reliability of a TFT even when an oxide semiconductor film is used for the semiconductor channel layer 7 of the TFT. Further, by using an oxidized material based semiconductor film with high mobility for the semiconductor channel layer 7 of the TFT, it is possible to manufacture TFT substrates operating at high speed and display devices using such TFT substrates at a high yield ratio, and therefore to manufacture high performance TFT substrates and liquid crystal displays with high productivity.

While the invention has been shown and described in detail, the foregoing description is in all aspects illustrative and not restrictive. It is therefore understood that numerous modifications and variations can be devised without departing from the scope of the invention.

What is claimed is:

1. A thin film transistor substrate having a plurality of pixels arranged in matrix,
    each of said pixels including a thin film transistor,
    said thin film transistor having:
        a gate electrode selectively provided on a substrate;
        a first insulating film covering said gate electrode;
        a semiconductor channel layer selectively provided on said first insulating film;
        a second insulating film provided on said semiconductor channel layer;
        a first source electrode and a first drain electrode selectively provided on said second insulating film, the first source electrode and the first drain electrode being provided with a space from each other;
        a second source electrode and a second drain electrode provided at least on said first source electrode and said first drain electrode, respectively, the second source electrode and the second drain electrode being provided with a space from each other;
        a third insulating film that covers at least said second source electrode and said second drain electrode;
        a third source electrode connected to said semiconductor channel layer via a first contact hole provided through said third insulating film, said second source electrode, and said first source electrode; and
        a third drain electrode connected to said semiconductor channel layer via a second contact hole provided through said third insulating film, said second drain electrode, and said first drain electrode;
    each of said pixels further including:
    a pixel electrode provided on said first insulating film, and extending from said second drain electrode; and
    a counter electrode provided on said third insulating film so as to face said pixel electrode in planar view, wherein
    said second source electrode, said second drain electrode, said third source electrode, said third drain electrode, and said counter electrode are configured by a translucent conductive film.

2. The thin film transistor substrate according to claim 1, wherein
    said pixels are selectively provided on said substrate, and includes a common wiring covered by the first insulating film, and said counter electrode is connected to said common wiring via a third contact hole provided through said first insulating film and said third insulating film.

3. The thin film transistor substrate according to claim 1, wherein
    said semiconductor channel layer is formed to have a planar pattern smaller than a planar pattern of said gate electrode in planar view, and provided such that an outline of said semiconductor channel layer is positioned inwardly as compared to an outline of said gate electrode.

4. The thin film transistor substrate according to claim 2, wherein
    said pixel electrode extends on said common wiring so as to overlap a part of said common wiring in planar view, and an auxiliary capacitance at a pixel potential is formed between said pixel electrode and said common wiring via said first insulating film.

5. The thin film transistor substrate according to claim 1, wherein
    said pixel includes:
        a semiconductor film selectively provided on said first insulating film, in a continuous pattern from said semiconductor channel layer; and
        a source wiring selectively provided on said second insulating film in a continuous pattern from said first source electrode.

6. The thin film transistor substrate according to claim 1, wherein
    said semiconductor channel layer is configured by oxide semiconductor.

7. The thin film transistor substrate according to claim 1, wherein
    one of said third source electrode and said third drain electrode is provided so as to extend above a channel region of said semiconductor channel layer.

8. The thin film transistor substrate according to claim 1, wherein
    said first insulating film includes a silicon nitride film and a silicon oxide film laminated in an order from said substrate.

9. The thin film transistor substrate according to claim 1, wherein
    said third insulating film includes a silicon oxide film and a silicon nitride film laminated in an order from said substrate.

10. A method for manufacturing a thin film transistor substrate having a plurality of pixels arranged in matrix, the method comprising the steps of:
    (a) selectively forming a gate electrode by forming a first conductive film on a substrate and patterning the first conductive film;
    (b) forming a first insulating film on said substrate so as to cover said gate electrode;
    (c) forming a laminated body by causing an oxide semiconductor film, a second insulating film, and a second conductive film to be laminated on said first insulating film in the stated order, and patterning;
    (d) forming a third conductive film having a light-blocking property so as to cover said laminated body, then patterning said third conductive film and said second conductive film, forming a first source electrode and a first drain electrode with a space between each other via said second insulating film on said semiconductor channel layer, and forming a second source electrode and a second drain electrode respectively on said first source electrode and said first drain electrode;

(e) forming a third insulating film so as to cover at least said second source electrode and said second drain electrode;

(f) providing a first contact hole and a second contact hole that reach said semiconductor channel layer, the first contact hole and the second contact hole being respectively provided through said second source electrode and said first source electrode, and through said third insulating film and said second insulating film; and (g) forming a translucent fourth conductive film on said third insulating film so as to fill said first contact hole and said second contact hole, then patterning said fourth conductive film, and forming a third source electrode connected to said semiconductor channel layer via said first contact hole, and a third drain electrode connected to said semiconductor channel layer via said second contact hole, wherein said step (d) includes:
    patterning said third conductive film; and
    forming a pixel electrode extending from said second drain electrode on said first insulating film, said step (g) includes:
    patterning said fourth conductive film; and
    forming a counter electrode on said third insulating film, the counter electrode facing said pixel electrode in planar view.

11. The method for manufacturing a thin film transistor substrate according to claim 10, wherein
    said step (d) includes forming a source contact hole that reaches said second insulating film through said second source electrode and said first source electrode, and a drain contact hole that reaches said second insulating film through said second drain electrode and said first drain electrode, and said step (e) includes forming a third insulating film so as to fill said source contact hole and said drain contact hole, and then removing said third insulating film and said second insulating film within said source contact hole and within said drain contact hole, said step (f) includes:
        forming of said source contact hole and said drain contact hole performed in said step (d); and
        removing of said third insulating film and said second insulating film within said source contact hole and within said drain contact hole performed in said step (e).

12. The method for manufacturing a thin film transistor substrate according to claim 10, wherein
    said step (a) includes patterning said first conductive film and forming a common wiring selectively,
    said step (b) includes forming said first insulating film on said substrate so as to cover said common wiring,
    said step (e) includes providing a third contact hole that reaches said common wiring through said third insulating film and said first insulating film on said common wiring, and
    said step (g) includes forming said counter electrode, and connecting said counter electrode to said common wiring through said third contact hole.

13. The method for manufacturing a thin film transistor substrate according to claim 10, wherein
    said step (c) includes patterning said oxide semiconductor film, said second insulating film, and said second conductive film using a common photoresist pattern, and
    said step (d) includes patterning said third conductive film and said second conductive film using a common photoresist pattern.

* * * * *